(12) United States Patent
Otsuka

(10) Patent No.: US 9,685,605 B2
(45) Date of Patent: Jun. 20, 2017

(54) MAGNETIC MEMORY DEVICE HAVING A MAGNETIC SHIELD STRUCTURE

(71) Applicant: KABUSHIKI KAISHA TOSHIBA, Tokyo (JP)

(72) Inventor: Masashi Otsuka, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/841,982

(22) Filed: Sep. 1, 2015

(65) Prior Publication Data

US 2016/0293833 A1 Oct. 6, 2016

(30) Foreign Application Priority Data

Mar. 30, 2015 (JP) ................. 2015-070398

(51) Int. Cl.
*H01L 43/02* (2006.01)
*H01L 27/22* (2006.01)
*H01L 43/08* (2006.01)

(52) U.S. Cl.
CPC ............ *H01L 43/02* (2013.01); *H01L 27/222* (2013.01); *H01L 43/08* (2013.01)

(58) Field of Classification Search
CPC ....... H01L 43/02; H01L 43/08; H01L 27/222; H01L 23/552; H01L 2924/3025
See application file for complete search history.

(56) References Cited

U.S. PATENT DOCUMENTS

| | | |
|---|---|---|
| 7,183,617 B2 | 2/2007 | Wang et al. |
| 8,536,684 B2 | 9/2013 | Chen et al. |
| 2009/0025211 A1* | 1/2009 | Hiner ............... H01L 23/552 29/832 |
| 2010/0230789 A1 | 9/2010 | Yorita et al. |
| 2013/0256819 A1 | 10/2013 | Watanabe et al. |
| 2014/0151859 A1 | 6/2014 | Kim et al. |
| 2014/0225208 A1* | 8/2014 | Gu ..................... H01L 43/02 257/422 |

FOREIGN PATENT DOCUMENTS

| | | |
|---|---|---|
| CN | 102339763 A | 2/2012 |
| CN | 102683222 A | 9/2012 |
| JP | 2013-207059 A | 10/2013 |
| TW | 200908270 A | 2/2009 |
| TW | 201438180 A | 10/2014 |
| WO | 2011111593 A1 | 9/2011 |

OTHER PUBLICATIONS

Taiwan Office Action dated Dec. 28, 2016, filed in Taiwan counterpart Application No. 104123911, 8 pages (with translation).

* cited by examiner

*Primary Examiner* — Tucker J Wright
(74) *Attorney, Agent, or Firm* — Patterson & Sheridan, LLP

(57) ABSTRACT

A magnetic memory device includes a magnetic memory unit having a plurality of magnetic memory cells, a first surface, and a second surface opposite to the first surface, the first and second surfaces extending in a direction parallel to a direction in which the magnetic memory cells are arranged, a first magnetic shield unit extending below the first surface, and a second magnetic shield unit having a first portion that extends over the second surface and a second portion that extends from the first portion towards the first magnetic shield unit and is directly in contact with the first shield magnetic unit.

20 Claims, 12 Drawing Sheets

MAGNETIC MEMORY DEVICE HAVING A MAGNETIC SHIELD STRUCTURE

CROSS-REFERENCE TO RELATED APPLICATION

This application is based upon and claims the benefit of priority from Japanese Patent Application No. 2015-070398, filed Mar. 30, 2015, the entire contents of which are incorporated herein by reference.

FIELD

Embodiments described herein relate generally to a magnetic memory device, in particular a magnetic memory device having a magnetic shield structure.

BACKGROUND

A magnetoresistive random access memory (MRAM) is known as a type of a nonvolatile memory.

DESCRIPTION OF THE DRAWINGS

FIG. 19A is a case where the host device is a mobile phone, and FIG. 19B is a case where the host device is a smart phone.

DETAILED DESCRIPTION

A magnetic memory device according to an embodiment reduces the influence of an external magnetic field with respect to a magnetic memory unit thereof.

In general, according to an embodiment, a magnetic memory device includes a magnetic memory unit having a plurality of magnetic memory cells, a first surface, and a second surface opposite to the first surface, the first and second surfaces extending in a direction parallel to a direction in which the magnetic memory cells are arranged, a first magnetic shield unit extending below the first surface, and a second magnetic shield unit having a first portion that extends over the second surface and a second portion that extends from the first portion towards the first magnetic shield unit and is directly in contact with the first shield magnetic unit.

Hereinafter, embodiments will be described with reference to the drawings.

In the present disclosure, several components are described by a plurality of expressions. These expressions are examples, and the components may be described by other expressions. In addition, components which are not described by a plurality of expressions may be expressed by other expressions.

In addition, the accompanying drawings are schematic and the relationship between the thickness and the dimension or the ratio of the thickness of each layer may be different from the actual one. Further, drawings may illustrate the portions whose dimensions and ratios are different from one another.

First Embodiment

Figure 1:
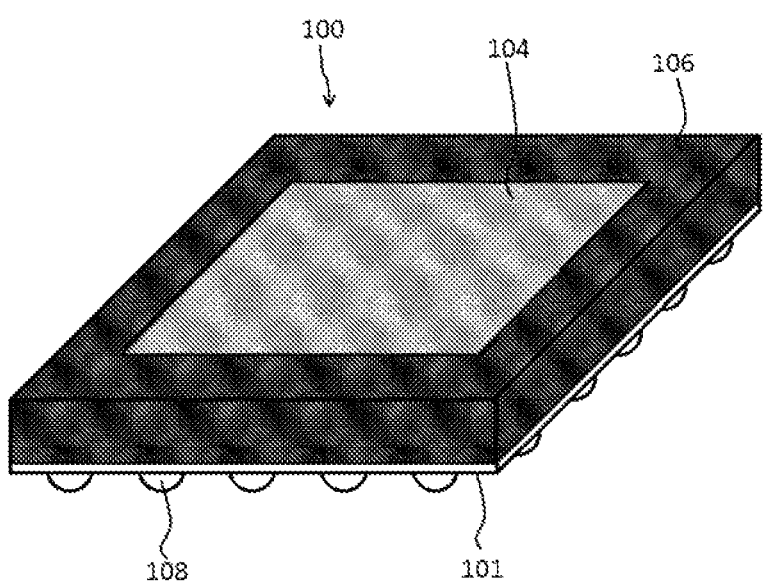
FIG. 1 is a perspective view of a memory device according to a first embodiment.
Figure 2:
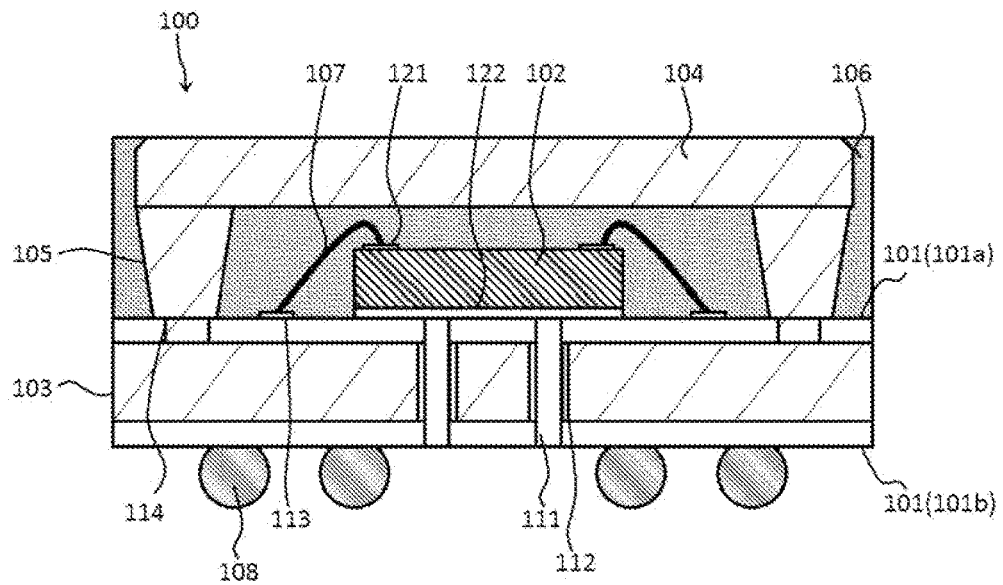
FIG. 2 is a cross-sectional view of the memory device according to the first embodiment.

FIG. 1 is a perspective view of a memory device 100 according to a first embodiment. In addition, FIG. 2 is a cross-sectional view of the memory device 100 according to the first embodiment. The memory device 100 has a substrate 101, a magnetoresistive memory chip 102, a first magnetic body (a magnetic layer) 103, a second magnetic body 104, a third magnetic body 105, a sealing portion (a molding material) 106, a bonding wire (a conductive portion) 107, and a solder ball (a second electrode) 108. Meanwhile, the memory device 100 in the present embodiment corresponds to, for example, a magnetoresistive memory.

In the present embodiment, the first magnetic body 103, the second magnetic body 104, and the third magnetic body 105 function as a magnetic shield for protecting the magnetoresistive memory chip 102 from an external magnetic field. Note that the "magnetic body" in the disclosure mainly indicates a "ferromagnetic body" (as long as it has a shield effect enough to prevent data in a chip from being modified).

The substrate 101 is, for example, a multilayer wiring board, and includes a power supply layer, a ground layer, or the like (not shown). The substrate 101 is a circuit board, which is formed into a substantially rectangular shape and formed of materials such as a glass epoxy resin, and defines the size of the memory device 100. The substrate 101 includes a first surface 101a and a second surface 101b opposite to the first surface 101a, and a connection terminal (first electrode) 113 is provided on the first surface 101a. In the disclosure, among the surfaces of the substrates 101, the surfaces other than the first surface 101a and the second surface 101b are referred to as side surfaces.

Figure 3:
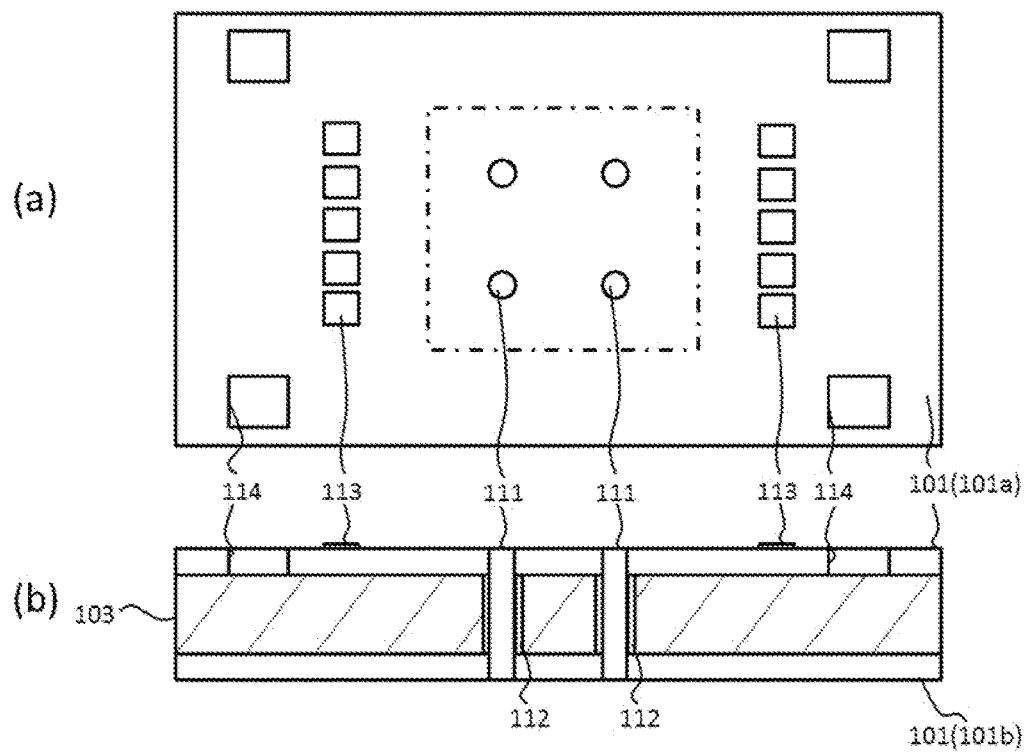
FIG. 3 illustrates a substrate of the memory device; (a) is a plan view of the substrate, and (b) is a cross-sectional view thereof.

FIG. 3 illustrates the substrate 101 according to the present embodiment, FIG. 3(a) is a plan view of the first surface 101a thereof, and FIG. 3(b) is a cross-sectional view of the substrate 101. An area indicated by a broken line in FIG. 3(a) corresponds to an area on which the magnetoresistive memory chip 102 is mounted.

The substrate 101 according to the present embodiment includes the first magnetic body 103 as a core material. A plurality of vias 111 passing through the first surface 101a and the second surface 101b are formed on the substrate 101. In addition, in a portion of the first surface 101a of the substrate 101, an opening is formed at a position different from the vias 111, and a connection portion 114, in which the first magnetic body 103 is partially exposed, is formed. Meanwhile, in the present embodiment, four connection portions 114 are provided, for example.

As described above, since the substrate 101 is the multilayer wiring board, the first magnetic body 103 is positioned between a layer including the first surface 101a and a layer including the second surface 101b. However, the first magnetic body 103 is not necessarily positioned at the center of the substrate 101 in the thickness direction, and may be offset towards the first surface 101a or the second surface 101b. At this time, a portion of the first magnetic body 103 is exposed on the side surface of the substrate 101.

The via 111 is a connection portion which electrically connects wiring in a lower layer and wiring in an upper layer in the multilayer wiring, and is formed by opening a via hole by etching an interlayer insulation film and then embedding a metallic material into the via hole. In the present embodiment, since the substrate 101 includes the first magnetic body 103 as the core material, the via hole needs to pass through the first magnetic body 103 between the upper layer (the first surface 101a side) to the lower layer (the second surface 101b side) of the substrate 101 as illustrated in FIG. 2.

The via 111 is formed by embedding the metallic material into the via hole as described above. However, since it is not preferable that the metallic material and the first magnetic body 103 are in contact with each other and thus are electrically connected to each other, an insulating portion 112 is provided on the surface of the via hole.

The magnetoresistive memory chip 102 has, for example, a substantially rectangular shape in a plan view. "plan view" in the present disclosure indicates a state of viewing down the memory device 100 (and the internal configuration thereof) in a direction perpendicular to directions in which the side surfaces of the substrate 101 extend in FIG. 1, that is, a direction from the top to the bottom in FIG. 2.

In addition, in the connection portion 114, "a partially exposed portion of the first magnetic body 103", means that it is possible to recognize the first magnetic body 103 when the substrate 101 is seen from the third magnetic body 105.

A pad 121 is provided on the magnetoresistive memory chip 102 in such a manner that the substrate 101 and the magnetoresistive memory chip 102 are connected to each other, and the connection terminal 113, which is provided on the substrate 101 and the pad 121, are electrically connected to each other through the bonding wire 107. In addition, the magnetoresistive memory chip 102 is attached to the substrate 101 using an adhesive (die bond agent) 122.

Figure 4:
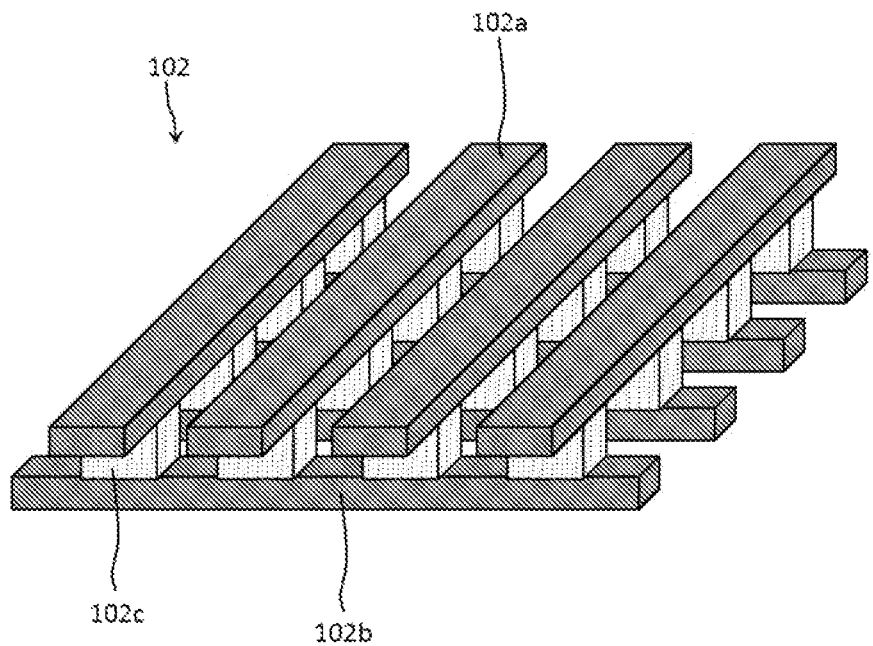
FIG. 4 is an enlarged perspective view of a portion of a magnetoresistive memory chip in the memory device.

FIG. 4 is an enlarged perspective view of a portion of the magnetoresistive memory chip 102. The magnetoresistive memory chip 102 includes a plurality of first wirings 102a, a plurality of second wirings 102b, and a plurality of magnetoresistive elements (magnetic memory cells) 102c. As illustrated in FIG. 4, the magnetoresistive elements 102c are arranged, and the first wirings 102a and the second wirings 102b which are lined up in mutually orthogonal directions are connected to the upper and lower surfaces thereof, respectively.

Figure 5:
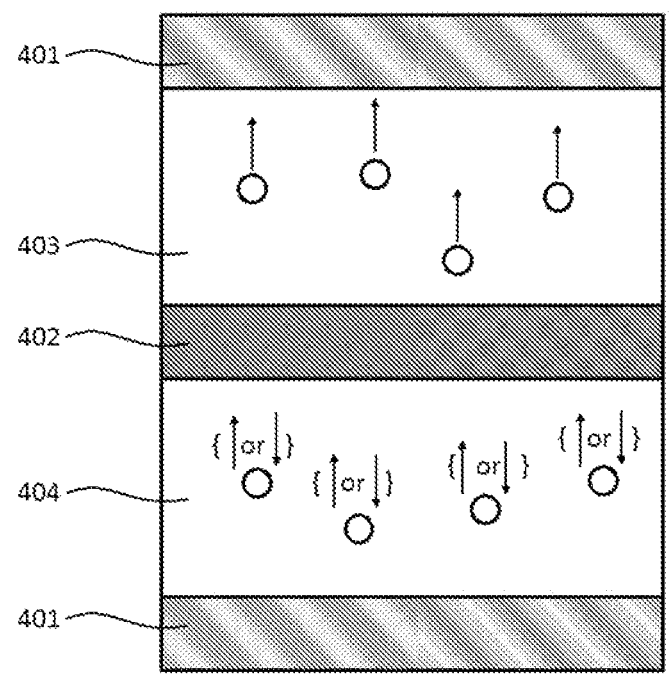
FIG. 5 schematically illustrates a cross section of a magnetoresistive element which forms the memory device.

FIG. 5 schematically illustrates a side cross section of the magnetoresistive element 102c. In FIG. 5, arrows (↓, ↑) indicate directions of an electron spin. The magnetoresistive element 102c includes, for example, a non-magnetic film 402 between a first magnetic film 403 and a second magnetic film 404, and each of the first magnetic film 403 and the second magnetic film 404 includes an electrode 401 on a surface opposite to the surface in contact with the non-magnetic film 402.

The non-magnetic film 402 is formed of a material which is not a ferromagnetic body, and is less likely to be magnetized compared with the first magnetic film 403 and the second magnetic film 404. The non-magnetic film 402 may be provided between the first magnetic film 403 and the second magnetic film 404 in such a manner that the first magnetic film 403 and the second magnetic film 404 are magnetically insulated from one another.

The direction of the electron spin in the first magnetic film 403 is constant, whereas the direction of the electron spin in the second magnetic film 404 may be changed by the magnetic field. For example, a case where the direction of the electron spin in the second magnetic film 404 is the same as the direction of the electron spin in the first magnetic film 403 is defined as "0", and a case where the direction of the electron spin in the second magnetic film 404 is different from the direction of the electron spin in the first magnetic film 403 is defined as "1", whereby it is possible to store either "0" or "1" as data.

Alternatively, the case where the direction of the electron spin in the second magnetic film 404 is the same as the direction of the electron spin in the first magnetic film 403 may be defined as "1", and the case where the direction of the electron spin in the second magnetic film 404 is different from the direction of the electron spin in the first magnetic film 403 may be defined as "0". In addition, the direction of the electron spin illustrated in FIG. 5 or a positional relationship of the first magnetic film 403 and the second magnetic film 404 is an example, and the magnetoresistive element 102c is configured such that one non-magnetic body is sandwiched between two magnetic bodies.

Figure 6:
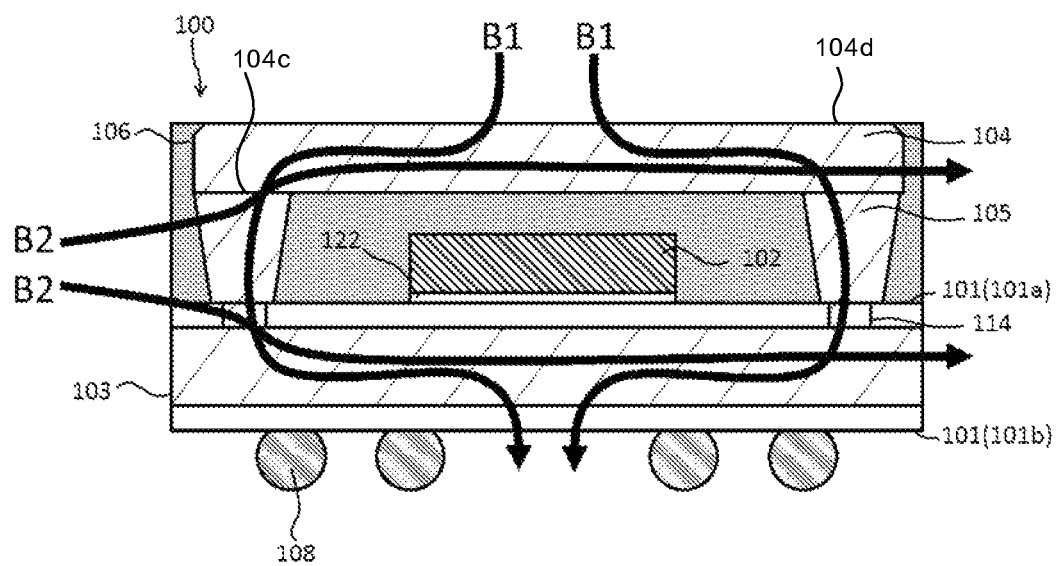
FIG. 6 is a cross-sectional view of the memory device according to the first embodiment to explain a shield effect.

FIG. 6 is a schematic cross-sectional view of the memory device 100 to explain a shield effect. In FIG. 6, for the sake of convenience in description, some portions configuring the memory device 100 are omitted. In the memory device 100, a magnetic flux (B1 in FIG. 6) which is a portion of magnetic flux flowing in the thickness direction (a vertical direction in FIG. 6) of the substrate 101 is shielded by the first magnetic body 103 and the second magnetic body 104.

The second magnetic body 104 is arranged above the magnetoresistive memory chip 102, and includes a third surface 104c which faces the first surface 101a of the substrate 101, and a fourth surface 104d opposite to the third surface 104c. The second magnetic body 104 is formed into a substantially rectangular shape in a plan view, and the size is larger than, for example, the magnetoresistive memory chip 102.

On the first surface 101a of the substrate 101, the third magnetic body 105 supports the second magnetic body 104. Specifically, the third magnetic body 105 is formed into, for example, a columnar shape, and fit into the connection portion 114 which is provided in the substrate 101. Meanwhile, the third magnetic body 105 is also connected to the second magnetic body 104. Accordingly, the second magnetic body 104 is, for example, constantly supported by four third magnetic bodies 105. With such a configuration, the first magnetic body 103 and the second magnetic body 104 are magnetically connected to each other via the third magnetic bodies 105.

Here, "magnetically connected" in the present embodiment may not mean that two components are physically in contact with each other as long as the direction of the magnetic flow is controlled.

Further, the third magnetic body 105 is fit into the connection portion 114 as described above. Here, the first magnetic body 103 may be recognized from the third magnetic body 105 in the opening of the connection portion 114. Therefore, even in a state where the third magnetic body 105 is fit into the connection portion 114, it is possible to describe that "the first magnetic body 103 is partially exposed in the connection portion 114".

Examples of the materials used for the first magnetic body 103, the second magnetic body 104, and the third magnetic body 105 may include, for example, a soft magnetic metal such as iron (Fe), nickel (Ni), or cobalt (Co), and a soft magnetic alloy such as a silicon steel (Fe—Si), a carbon steel (Fe—C), or a permalloy (Fe—Ni), or a ferritic stainless steel. Note that, materials used for the first magnetic body 103, the second magnetic body 104, and the third magnetic body 105 are not limited to the above described materials. In addition, as the "magnetic material" in the present disclosure, the soft magnetic metal and soft magnetic alloy are exemplified. However, the magnetic material is not limited thereto as long as a material may control the magnetic flow by the first magnetic body 103, the second magnetic body 104, and the third magnetic body 105.

The first magnetic body 103, the second magnetic body 104, and the third magnetic body 105 function as the magnetic shield of the magnetoresistive memory chip 102. The thickness of each of the first magnetic body 103, the second magnetic body 104, and the third magnetic body 105 is, for example, in a range of 50 μm or more to 500 μm or less. When the thickness of each of the first magnetic body 103, the second magnetic body 104, and the third magnetic body 105 is smaller than 50 μm, a satisfactory magnetic shield effect may not be obtained. Meanwhile, when the thickness of each of the first magnetic body 103, the second magnetic body 104, and the third magnetic body 105 is greater than 500 μm, the size and the thickness of the memory device 100 may not be sufficiently reduced.

The sealing layer 106 seals the magnetoresistive memory chip 102, the first magnetic body 103, the second magnetic body 104, the third magnetic body 105, and the bonding wire 107. At the same time, the sealing layer 106 may cover other parts in a state where, for example, the fourth surface 104*d* of the second magnetic body 104 is exposed, or may completely cover the fourth surface 104*d*. A case in which the fourth surface 104*d* is exposed may be also described as "sealing" in the present disclosure. Examples of the material used for the sealing layer 106 may include, for example, a thermosetting epoxy resin, but are not limited thereto, as long as areas between the second magnetic body 104, the third magnetic body 105, and the magnetoresistive memory chip 102 are protected.

When the sealing layer 106 completely covers the second magnetic body 104, it is possible to display certain information that a contents maker desires on a surface of the memory device 100 (that is, the sealing layer 106). For example, it is possible to form an identifying mark by a laser. In addition, when the identifying mark is formed by the laser, the second magnetic body 104 may protect the magnetoresistive memory chip 102 from the laser.

Here, effects of the magnetic shield of the memory device 100 according to the present embodiment will be described with reference to FIG. 6. The magnetic flux B1 which enters the memory device 100 from the upper direction in FIG. 6 is lead into the second magnetic body 104. Thereafter, the magnetic flux B1 flows into the third magnetic body 105, and the first magnetic body 103, and toward the direction of the second surface 101*b* of the substrate 101.

In addition, the magnetic flux (B2 in FIG. 6) which is a portion of the magnetic flux flowing into a surface direction of the substrate 101 (a horizontal direction in FIG. 6) is shielded by the third magnetic body 105. The magnetic flux B2 which enters the memory device 100 from the left direction in FIG. 6 is lead into the third magnetic body 105. Thereafter, the magnetic flux B2 flows into the first magnetic body 103 or the second magnetic body 104, in the right direction in FIG. 6. Note that, the shield effect by the third magnetic body 105 at this time is different depending on the thickness of the third magnetic body 105. As described above, the shield effect against the magnetic fluxes B1 and B2 may be obtained.

Meanwhile, in the present embodiment, the magnetoresistive memory chip 102 is stronger with respect to the magnetic flux (B2) in the lateral direction (the horizontal direction in FIG. 6), and is weaker with respect to the magnetic flux (B1) in the thickness direction (vertical direction in FIG. 6) of the magnetoresistive memory chip 102. This is because when the magnetic flux B1 enters the magnetoresistive memory chip 102 and the direction of the magnetic flux B1 is opposite (antiparallel) to the direction of the electron spin (an arrow direction in FIG. 4) in the second magnetic film 404, the direction of electron spin in the second magnetic film 404 may be reversed by the magnetic flux B1. This is undesirable because the data is unintentionally rewritten. In the present embodiment, the structure that the third magnetic bodies 105 do not completely cover the side surfaces of the magnetoresistive memory chip 102 does not have a significant influence on the shield effect.

Meanwhile, in FIG. 6, the magnetic flux from the upper direction to the lower direction is set as the magnetic flux B1, but the same is true for the magnetism which flows in the opposite direction (from the lower direction to the upper direction in FIG. 6). In addition, in FIG. 6, the magnetic flux from the left direction to the right direction is set as the magnetic flux B2, but the same is true for the magnetism which flows in the opposite direction (from the right direction to the left direction in FIG. 6).

In addition, as described above, the first magnetic body 103 and the second magnetic body 104 are connected to each other via the third magnetic bodies 105, and a path for the magnetic flux B1 is formed therein to protect the magnetoresistive memory chip 102. Therefore, it is not necessary to provide a plurality of third magnetic bodies 105 such that all of the third magnetic bodies 105 are physically in contact with the first magnetic body 103 and the second magnetic body 104, as long as the first magnetic body 103 and the second magnetic body 104 are magnetically connected to each other by at least one third magnetic body 105.

Meanwhile, when the first magnetic body 103 and the second magnetic body 104 are physically connected to each other via the plurality of third magnetic bodies 105, the magnetic flux B1 which enters the second magnetic body 104 flows to the first magnetic body 103 via the third magnetic body 105 which is positioned at a position closest to the entering position of the magnetic flux B1. For this reason, for example, as compared with the case of providing one third magnetic body 105, it is possible to lead the magnetic flux B1 more stably flow from the second magnetic body 104 to the first magnetic body 103 by providing the plurality of third magnetic bodies 105 as in the present embodiment.

Here, as a comparative example, a case where the first magnetic body 103 is not the core material of the substrate 101 is considered. If the first magnetic body 103 is formed on the first surface 101a of the substrate 101, the first magnetic body 103 has to be arranged on the substrate 101 so as to avoid a part in which the bonding wire 107 and the substrate 101 are connected to each other (the connection portion 114 in the present embodiment). Therefore, it is necessary to perform a process to avoid the bonding wire 107, or reduce the size of area of the first magnetic body 103.

In contrast, in the present embodiment, the first magnetic body 103 is the core material of the substrate 101, the size of the area of the substrate 101 of the first magnetic body 103 in the surface direction is the same as that of the area of the substrate 101. In addition, the size of second magnetic body 104 is larger than that of the magnetoresistive memory chip 102 in a plan view, as described above. As a result, the memory device 100 according to the present embodiment may obtain the satisfactory shield effect against the magnetic flux B1 shown in FIG. 6.

Further, the second magnetic body 104 according to the present embodiment is not connected to the magnetoresistive memory chip 102 by the adhesive 122 or the like. Instead, the second magnetic body 104 is supported by the third magnetic body 105 and the third surface 104c of the second magnetic body 104 and the magnetoresistive memory chip 102 separated from one another.

If the second magnetic body 104 and the magnetoresistive memory chip 102 are connected to each other using the adhesive 122, or the second magnetic body 104 and the magnetoresistive memory chip 102 would be in direct contact with each other, positions of the pad 121 and the bonding wire 107 should be taken into consideration. When the second magnetic body 104 is formed so as to avoid the positions of the pad 121 and the bonding wire 107, some areas of the magnetoresistive memory chip 102 may not be covered with the second magnetic body 104.

In contrast, in the present embodiment, as described above, the second magnetic body 104 is supported by the third magnetic bodies 105, the third surface 104c of the second magnetic body 104 and the magnetoresistive memory chip 102 are apart from one another. As the magnetoresistive memory chip 102 may be more sufficiently covered with the second magnetic body 104 in a plan view, it is possible to improve the shield effect.

In addition, in the present embodiment, the third magnetic body 105 which supports the second magnetic body 104 is the magnetic material, and thus it is possible to obtain the shield effect against B2 in FIG. 6 by the third magnetic body 105.

Here, the third magnetic body 105 may not shield the entire flows of the magnetic flux B2. This is because it is necessary that the molding material flows in the surface direction of the substrate 101 when the sealing layer 106 is formed in the manufacturing process of the memory device 100. Depending on types or the viscosity of the molding material used, the size (the thickness) of the third magnetic body 105 may be changed, and thus the shield effect against the magnetic flux B2 may be changed.

For example, when the viscosity of the molding material is relatively small, it is possible to improve the shield effect against the magnetic flux B2 by reducing a gap between the third magnetic bodies 105 which are adjacent to each other (enlarging the width of the third magnetic body 105).

On the other hand, when the width of the third magnetic body 105, which is a unit configured to magnetically connect the first magnetic body 103 and the second magnetic body 104 to each other, is great (the area is large), it is possible to more reliably lead the magnetic flux B1 to a desired direction, thereby improving the magnetic shield effect against the magnetic flux B1.

In the aforementioned description, the area between the plurality of third magnetic bodies 105 is formed into a cavity for allowing the molding material to flow, for example, the third magnetic bodies 105 may be connected to each other by, for example, a lattice-shaped magnetic body plate having an opening formed thereon. In this case, the shield effect against both magnetic fluxes B1 and B2 can be improved while securing a path for allowing the molding material to flow.

Figure 7:
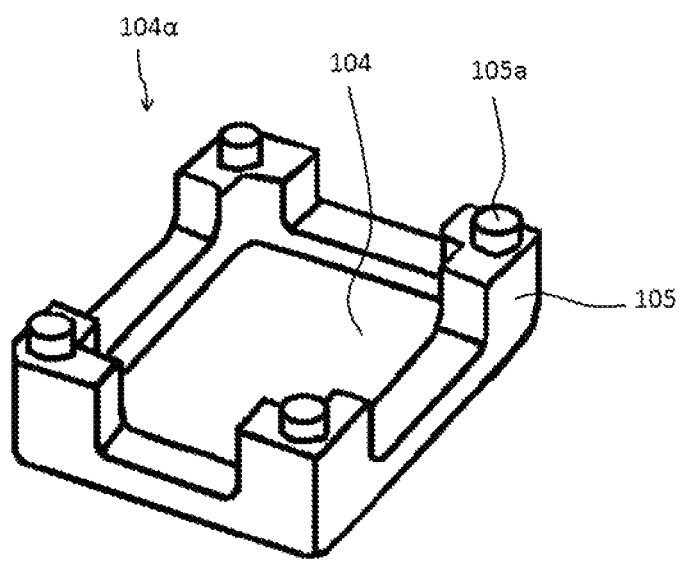
FIG. 7 is a perspective view of an integrated magnetic body of a second magnetic body and a third magnetic body.

In the present embodiment, for the sake of convenience in description, the second magnetic body 104 and the third magnetic body 105 are described as an individual body, but by processing a single magnetic body member as illustrated in FIG. 7, the second magnetic body 104 and the third magnetic body 105 may be integrated as "a second magnetic body 104α." In this case, an assembly process of the memory device 100 can be simplified.

The second magnetic body 104α includes a plurality of protruding portions 105a as illustrated in FIG. 7. As described above, in the present embodiment, the second magnetic body 104α (the third magnetic body 105) is fit into the connection portions 114 provided on the substrate 101, that is, each of the protruding portions 105a is fit into one of the connection portions 114. The protruding portion 105a is fit into the connection portion 114, and thus the protruding portion 105a is in contact with the first magnetic body 103. As a result, the second magnetic body 104α (the third magnetic body 105) and the first magnetic body 103 are magnetically connected to each other.

In the present embodiment, the protruding portion 105a is not an essential component, and a portion of the second magnetic body 104α (third magnetic body 105), instead of the protruding portion 105a, may be fit into the connection portion 114.

As described above, if the second magnetic body 104 and the third magnetic body 105 are integrally formed as "the second magnetic body 104α," it is possible to manufacture "the second magnetic body 104α" by forging (pressing) or cutting a magnetic body. In addition, if the magnetic body is formed into a thin substrate, a folding process may be employed to form the second magnetic body 104α. By carrying out the folding process, it is possible to improve the production yield rate in the manufacturing process. In the following description, the second magnetic body 104α will be mainly used.

Herein below, a manufacturing procedure of the memory device 100 according to the present embodiment will be described with reference to FIG. 8 to FIG. 13, each of which illustrates a cross-sectional view of a structure during the process. In addition, the manufacturing procedure will be described after the substrate 101 is prepared. Accordingly, a process of providing the via 111 or the connection terminal 113 on the substrate 101 will not be described. In addition, the substrate 101 includes the first magnetic body 103 as the core material. Further, the above described second magnetic body 104α is used in the manufacture of the memory device 100.

Figure 8:
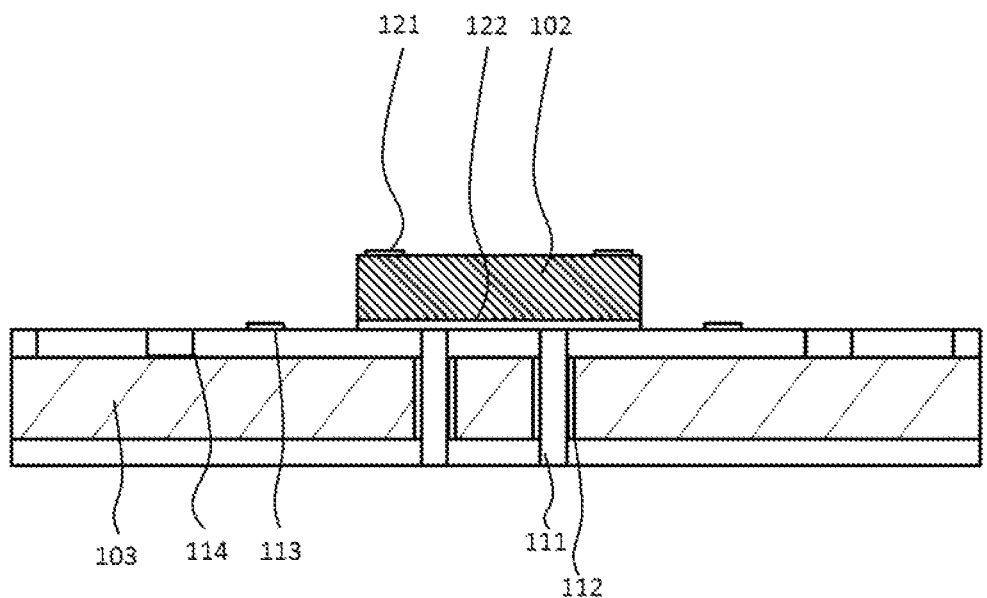
FIGS. 8-13 each are a cross-sectional view of a structure during a manufacturing process of the memory device according to the first embodiment.

First, as illustrated in FIG. 8, the magnetoresistive memory chip 102 is fixed to a predetermined position of the received substrate 101. At this time, the adhesive (die bonding agent) 122 is used to fix the magnetoresistive memory chip 102, and this process is referred to as a die bonding.

Figure 9:
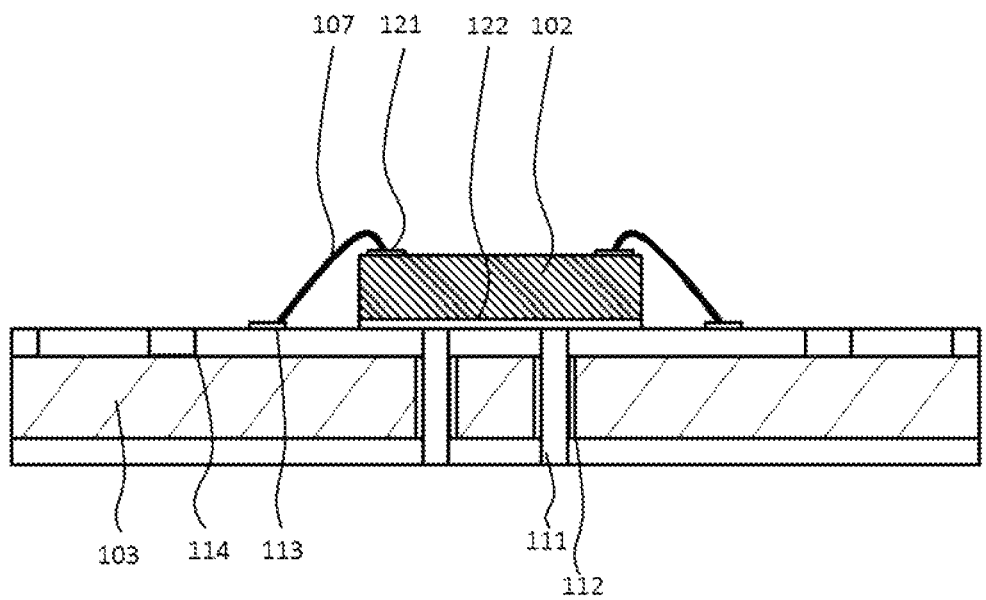

Next, an electrical connection between die bonded magnetoresistive memory chip 102 and the substrate 101 is established. As illustrated in FIG. 9, the pad 121 provided on the magnetoresistive memory chip 102 and the connection terminal 113 provided on the substrate 101 are electrically connected to each other using the bonding wire 107. Examples of the material used for the bonding wire 107 may include, for example, gold, aluminum, copper, or the like; however, the materials are not limited thereto. This process is referred to as a wire bonding.

Figure 10:
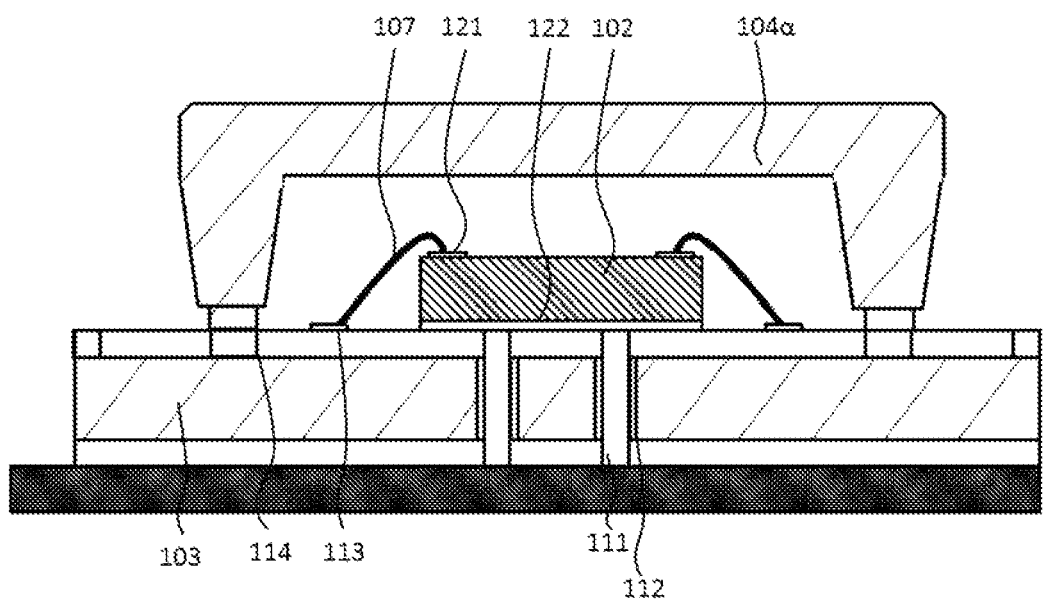
Figure 11:
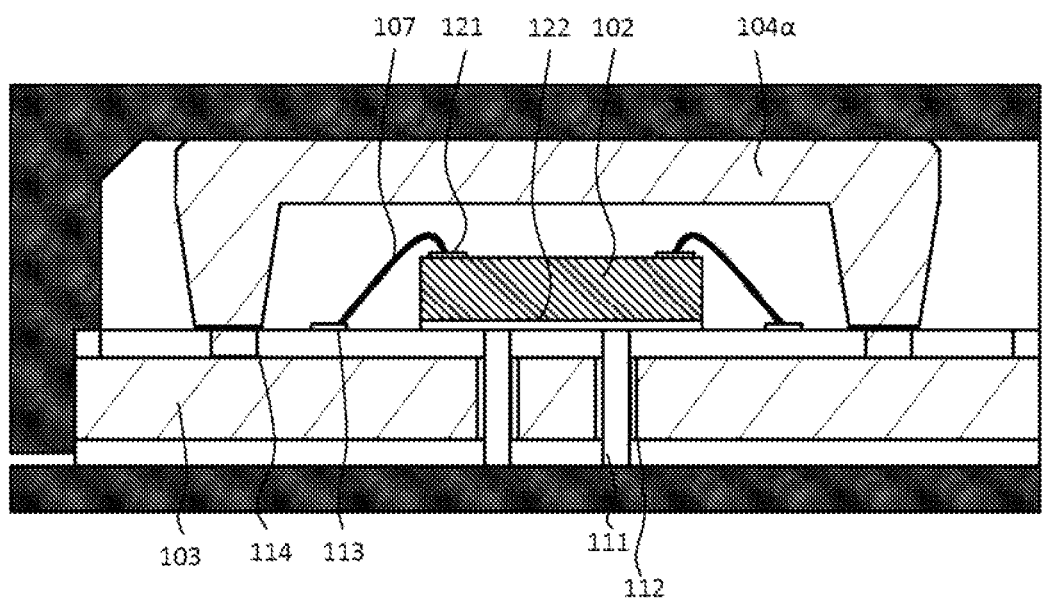

Further, as illustrated in FIG. 10, the second magnetic body 104α is mounted on the substrate 101. Then, protrusions of the second magnetic body 104α are fit into the connection portions 114 on the substrate 101 using a mold for sealing. That is, portions of the second magnetic body 104α are inserted into the first magnetic body 103 as illustrated in FIG. 11. Through this process, the first magnetic body 103 and the second magnetic body 104α are in direct contact with each other.

Here, a case where the second magnetic body 104α is fixed using the adhesive or the like instead of being fit into the substrate 101 is considered. In this case, the second magnetic body 104α and the first magnetic body 103 are connected to each other via the non-magnetic body, and thus the shield effect may be decreased. Accordingly, in order to more securely obtain the magnetic shield, it is preferable that the materials of the magnetic bodies (in the present embodiment, the second magnetic body 104α and the first magnetic body 103) used for shielding are in direct contact with each other.

In contrast, in the present embodiment, portions of the second magnetic body 104α (protruding portions 105a) are inserted into the first magnetic body 103, and thus the portions of the second magnetic body 104α are in direct contact with the first magnetic body 103. For this reason, it is possible to obtain more stable shield effect against the magnetic flux B1.

In addition, the opening area of the connection portion 114 is preferably smaller than a cross section of the portion (protruding portion 105a) of the second magnetic body 104α that is fit into the connection portion 114. If the opening area is smaller than the protruding portion 105a, when the protruding portion 105a is press-fit into the connection portion 114 using the mold for sealing, it is possible to firmly fix through plastic deformation of the metal.

Figure 12:
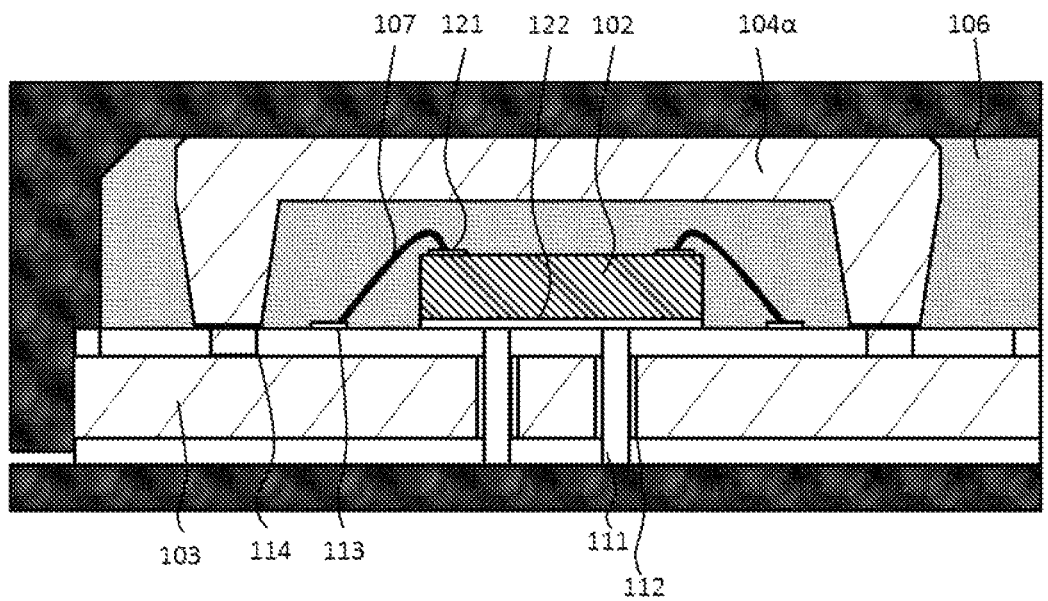

Further, a groove that may fit the protruding portion 105a may be formed on a surface of the first magnetic body 103, and the protruding portion 105a of the second magnetic body 104α may be inserted into the groove of the first magnetic body 103. In the description of the present embodiment, since the size of the opening area which forms the connection portion 114 is smaller than the area of the protruding portion 105a inserted thereto, it is possible to firmly fix the second magnetic body 104α. Thereafter, as illustrated in FIG. 12, the molding material 106 is poured into a mold while adding heat to the molding material 106, and when the mold is entirely filled with the molding material 106, the mold is left as it is for a while to cool the mold. After a while, the molding material 106 is fixed onto the substrate 101, and the molding material 106 which is in a liquid state is solidified. As described above, the sealing layer 106 may completely cover the second magnetic body 104α (the second magnetic body 104), but here, the second magnetic body 104α is exposed on the upper portion of the memory device 100.

In addition, as described above, since the second magnetic body 104α is inserted into the connection portion 114 and firmly fixed to the substrate 101, the position of the second magnetic body 104α is not moved during the process of pouring the molding material 106, whereby it is possible to increasing the sealing accuracy.

By adopting the configuration that the second magnetic body 104α is inserted into the connection portion 114, it is not necessary to connect the second magnetic body 104α to the first magnetic body 103 using a resin adhesive or the like, during the process of pouring the molding material 106. For this reason, it is possible to manufacture the memory device 100 without a gap, in which a non-magnetic body is filled, between the second magnetic body 104α and the first magnetic body, so that the shield effect can be more reliably obtained.

Here, the protruding portion 105a in the present embodiment is not an essential component, as long as it is possible to pour the molding material 106 into the mold in a state where at least the second magnetic body 104α and the first magnetic body 103 are constantly in contact with each other. Accordingly, a portion of the second magnetic body 104α, instead of the protruding portion 105a, may be inserted into the connection portion 114.

Figure 13:
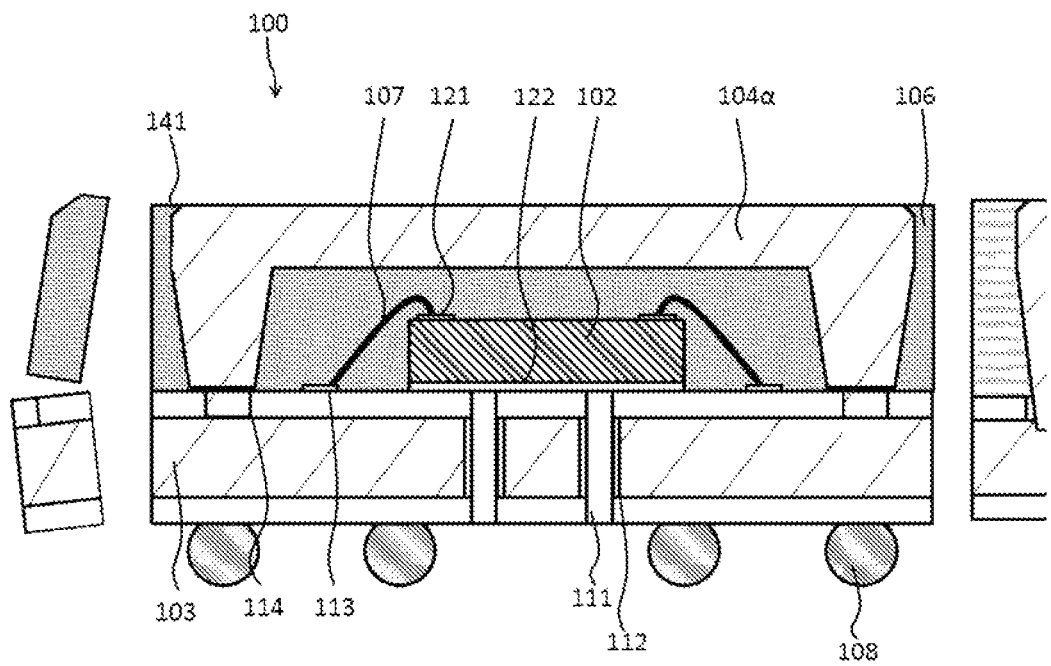

Then, the memory device 100 according to the present embodiment illustrated in FIG. 13 is manufactured by mounting the solder ball 108, which connects other components, on the second surface 101b of the substrate 101, and cutting the substrate 101 into pieces.

Here, the solder ball 108 is not necessarily mounted on the substrate 101. For example, the solder ball 108 may be mounted later with the suitable position and numbers in accordance with the usage when using the memory device 100. In this case, the second surface 101b of the substrate 101 may have an electrode electrically connected to the internal wiring of the substrate 101, and the electrode may be used as the second electrode 108.

As illustrated in FIG. 13, the second magnetic body 104α has a slope portion 141. The second magnetic body 104α is less likely to be detached from the sealing layer 106, because the molding material 106 more surely flows into the slope portion 141 and then is solidified.

Figure 14:
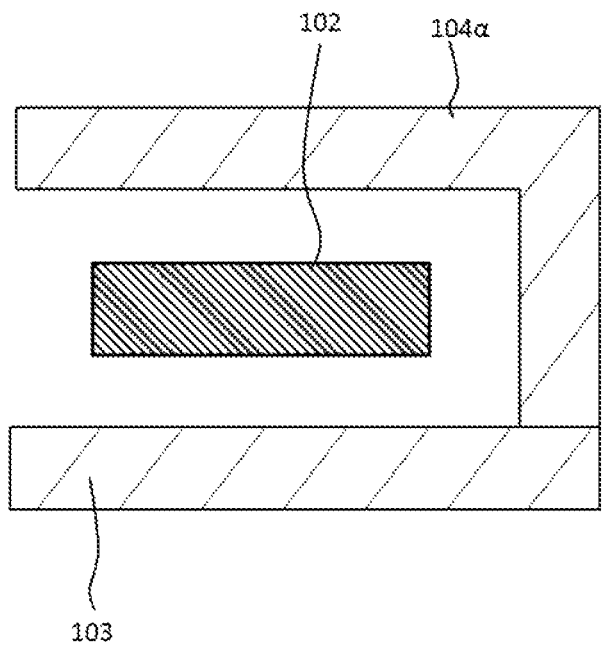
FIG. 14 schematically illustrates the memory device according to the first embodiment.

FIG. 14 schematically illustrates the memory device 100 according to the present embodiment. As illustrated in FIG. 14, the magnetic shield in the present embodiment may be formed by at least the magnetoresistive memory chip 102, the first magnetic body 103, and the second magnetic body 104α. Here, the direction of the magnetoresistive memory chip 102 in FIG. 14 is the same as directions of the magnetoresistive memory chips 102 illustrated in FIGS. 1 to 13.

As described above, since the magnetoresistive memory chip 102 is less susceptible to the magnetic flux (B2) in the horizontal direction, the side surface of the magnetoresistive memory chip 102 is not necessarily covered by the magnetic body.

On the other hand, the magnetoresistive memory chip 102 is shielded by the first magnetic body 103 and the second magnetic body 104α against the magnetic flux B1. At this time, in a plan view, when the magnetoresistive memory chip 102 is covered with the first magnetic body 103 and the second magnetic body 104α, and the first magnetic body 103 and the second magnetic body 104α are in contact with each other, it is possible to obtain the high magnetic shield effect.

Here, the first magnetic body 103 and the second magnetic body 104α may not be in direct contact and, instead, may be connected to each other via other magnetic bodies.

If a member for connecting the first magnetic body 103 and the second magnetic body 104α is required, the member should be a magnetic body.

Here, it is assumed that the first magnetic body 103 and the second magnetic body 104α are connected to each other via the non-magnetic body (for example, the adhesive or the like). In this case, the non-magnetic body (area having low permeability) is formed between the first magnetic body 103 and the second magnetic body 104α which have high permeability, and thus the efficiency of the flow of the magnetism from the first magnetic body 103 to the second magnetic body 104α (or from the second magnetic body 104α to the first magnetic body 103) may be deteriorated. In other words, the flow of the magnetic flux is interrupted by the non-magnetic body (area having the low permeability), and the magnetic leakage into the magnetoresistive memory chip 102 may be caused.

In contrast, in the present embodiment, since the first magnetic body 103 and the second magnetic body 104α are in direct contact with each other, as described above, it is possible to obtain the high magnetic shield effect.

Second Embodiment

Figure 15:
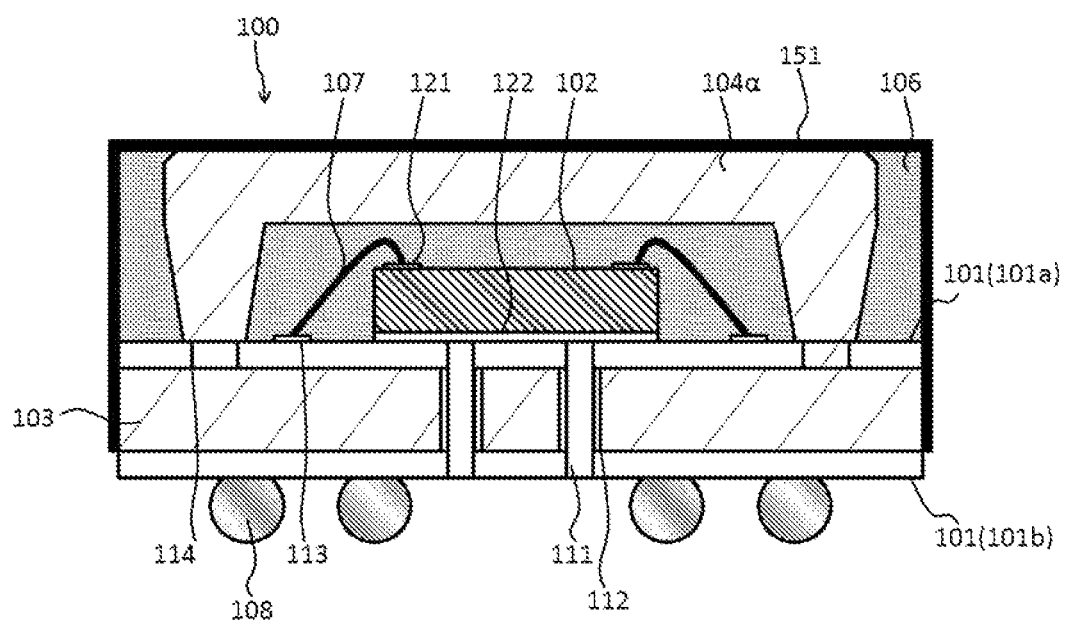
FIG. 15 is a cross-sectional view of a memory device according to a second embodiment.

FIG. 15 is a cross-sectional view of the memory device 100 according to the second embodiment. In the description of the present embodiment, regarding the same components as those in the first embodiment are described with the same reference numerals and the detailed description thereof will be omitted.

In the present embodiment, a magnetic shield material 151 is further provided on the surface of the memory device according to the first embodiment. The magnetic shield material 151 is, for example, an organic resin mixed with a magnetic filler, and the surface of the memory device 100 is coated with the organic resin. At this time, a portion of the magnetic shield material 151 is in contact with the first magnetic body 103, which is exposed on the side surfaces of the substrate 101.

In the present embodiment, a double shield against the magnetic flux B1 is formed with the magnetic shield material 151 and the second magnetic body 104 (second magnetic body 104α), and thus it is possible to obtain a higher magnetic shield effect. In addition, in the same way, the double shield against the magnetic flux B2 is formed with the magnetic shield material 151 and the third magnetic body 105 (second magnetic body 104α), and thus it is possible to obtain the higher magnetic shield effect. Further, since the first magnetic body 103 and the magnetic shield material 151 are in contact with the entire side surface of the substrate 101, the shield effect against the magnetic flux B1 can be improved.

In the present embodiment, the magnetic shield material 151 may be a soft magnetic metal or a soft magnetic alloy, which is used for the first magnetic body 103 or the second magnetic body 104α. In this case, it is necessary to connect the magnetic shield material 151 to the sealing layer 106. The magnetic shield material 151 may be connected using, for example, an organic resin adhesive mixed with the magnetic filler, and the first magnetic body 103 and the second magnetic body 104α may be in direct contact with each other without using the adhesive or the like in a portion of the side surface of the substrate 101 which is connected to the first magnetic body 103.

Third Embodiment

Figure 16:
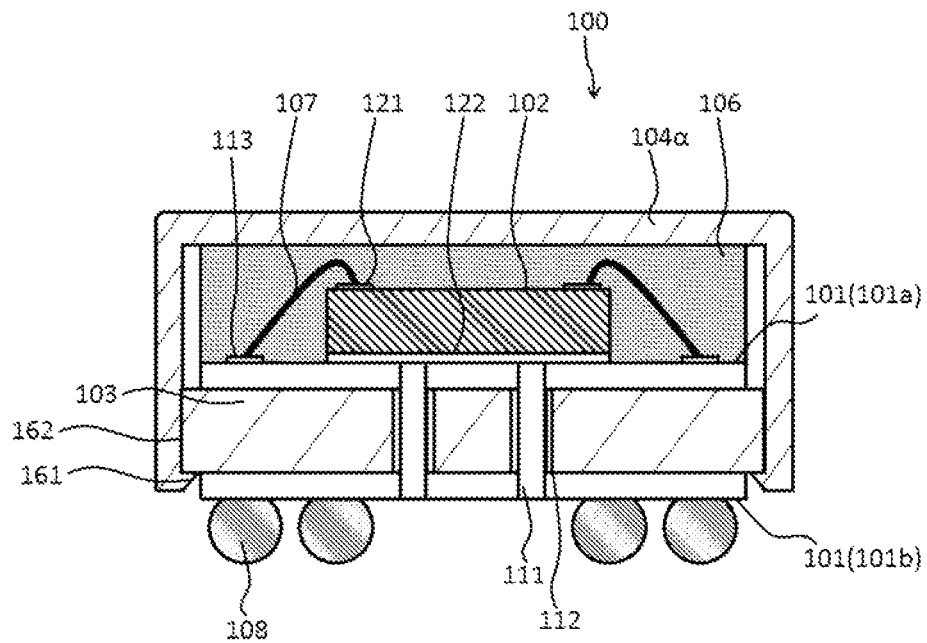
FIG. 16 is a cross-sectional view of a memory device according to a third embodiment.

FIG. 16 is a cross-sectional view illustrating the side surface of the memory device 100 according to the third embodiment. In the description of the present embodiment, the same components as those in the first embodiment or the second embodiment, components are described with the same reference numerals and the detailed description thereof will be omitted.

In the present embodiment, the memory device 100 includes the second magnetic body 104α on the outside of the sealing layer 106. The second magnetic body 104α includes a bend portion 161 as illustrated in FIG. 16. In addition, the substrate 101 includes projections 162, which is a part of the first magnetic body 103 and projects from the side surfaces of the substrate 101.

The bend portion 161, which is provided in the second magnetic body 104α, is engaged with the projection 162 and is in contact with the first magnetic body 103. Accordingly, similar to the first and second embodiments, it is possible to obtain the magnetic shield effect against both magnetic fluxes B1 and B2 by the first magnetic body 103 and the second magnetic body 104α.

In addition, since it is possible to engage the second magnetic body 104α after the sealing process, working processes to prepare the substrate 101 may be decreased. Further, it is possible to easily detach and exchange the second magnetic body 104α.

Further, if the second magnetic body 104α is positioned outside the sealing layer 106, it is not necessary to pour the molding resin 106 when processing the second magnetic body 104α. As a result, the side surfaces of the second magnetic body 104α can more extensively perform the shielding against the magnetic flux B2. Further, since a portion which connects the first magnetic body 103 and the upper surface of the second magnetic body 104α is large, it is possible to obtain the stable shield effect against both magnetic fluxes B1 and B2.

In the present embodiment, it is not necessary that only the first magnetic body 103 protrudes from the side surfaces of the substrate 101 as long as the bend portion 161 of the second magnetic body 104α is engaged with the first magnetic body 103 in a state of being in contact with each other.

Fourth Embodiment

Figure 17:
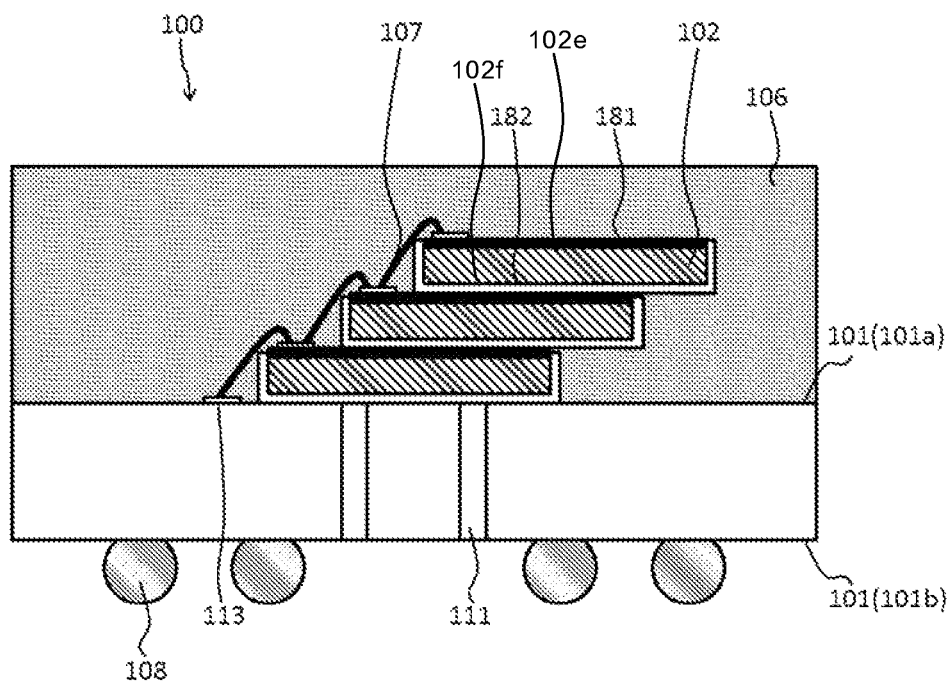
FIG. 17 is a cross-sectional view of a memory device according to a fourth embodiment.

FIG. 17 is a cross-sectional view of the memory device 100 according to a fourth embodiment. In the description of the present embodiment, the same components as those of the first to third embodiments are described with the same reference numerals and the detailed description thereof will be omitted. The memory device 100 according to the present embodiment includes a structure in which a plurality of magnetoresistive memory chips 102 is stacked in the sealing layer 106, and the respective magnetoresistive memory chips 102 are electrically connected to each other via the bonding wire 107.

The magnetoresistive memory chip 102 includes a fifth surface 102e (the upper side in FIG. 17) and a sixth surface 102f (the lower side in FIG. 17), which is opposite to the fifth surface 102e. Then, other surfaces are defined as side surfaces.

The fifth surface 102e of the magnetoresistive memory chip 102 is coated with a coating agent 181. The coating agent 181 is, for example, formed of polyimide (PI), and the magnetic material filler is mixed thereinto in the present embodiment.

An adhesive 182 is provided on the sixth surface 102f. The adhesive 182 is, for example, formed of a die attach film (DAF), and the magnetic material filler is added thereinto in the present embodiment. A portion of the adhesive 182 is in contact with the coating agent 181 which is provided in the magnetoresistive memory chip 102, in an adhesive curing process.

In the memory device 100 according to the present embodiment, the fifth surface 102e of the respective magnetoresistive memory chips 102 is coated with the coating agent 181. The aforementioned coating is performed, for example, before the magnetoresistive memory chip 102 is cut into individual pieces (a state of wafer). The coating is performed, for example, by a spin coating method.

The adhesive 182 is attached to the sixth surface 102f of the magnetoresistive memory chip 102. Similar to the coating described above, the adhesive 182 is attached before the magnetoresistive memory chip 102 is cut into individual pieces (the state of wafer).

Thereafter, in a dicing process, the wafer is cut into the plurality of magnetoresistive memory chips 102 in which the coating agent 181 is formed on the fifth surface 102e and the adhesive 182 is formed on the sixth surface 102f.

The magnetoresistive memory chips 102 manufactured as described above are stacked by a predetermined number. Although FIG. 17 illustrates a state in which three magnetoresistive memory chips 102 are stacked, the number of the magnetoresistive memory chips 102 is not limited thereto. For example, the number of the magnetoresistive memory chips 102 may be two, or four or more, or may be one as in the first to third embodiments.

In the subsequent manufacturing process of the memory device 100, the adhesive 182 is temporarily softened by heat. At this time, a portion of the adhesive 182 comes in contact with the coating agent 181 formed on the fifth surface 102e by raising the side surface of one magnetoresistive memory chip 102, and the other portion comes in contact with the coating agent 181 formed on the fifth surface 102e of the other magnetoresistive memory chip 102.

As a result, the magnetoresistive memory chip 102 is shielded from the external electric field in the same manner as those in the first to third embodiments.

In addition, in the present embodiment, even though the plurality of magnetoresistive memory chips 102 is used, since the magnetoresistive memory chips 102 to which the coating agent 181 and the adhesive 182 are applied is simply stacked, the manufacturing process would not be complicated too much.

Furthermore, the coating agent 181 may be provided on both of the fifth surface 102e and the sixth surface 102f of the magnetoresistive memory chip 102, and the adhesive 182 may be provided on both of the fifth surface 102e and the sixth surface 102f. In addition, the side surfaces of the magnetoresistive memory chip 102 may not be entirely covered with the coating agent 181.

In addition, in the present embodiment, the respective magnetoresistive memory chips 102 may be electrically connected to each other by the bonding wire 107 that includes the magnetic material filler, or the bonding wire 107 may be coated with the coating agent 181. In this case, magnetoresistive memory chips 102 are electrically connected to each other, and at the same time, the coating agents 181, or the coating agent 181 and the adhesive 182 are magnetically connected to each other. The magnetic flux B1 lead to the coating agent 181 is lead to the second surface 101b of the substrate 101 via the bonding wire 107 and the coating agent 181, or the adhesive 182. As a result, it is possible to obtain the shield effect against the magnetic fluxes B1 and B2.

Fifth Embodiment

Figure 18:
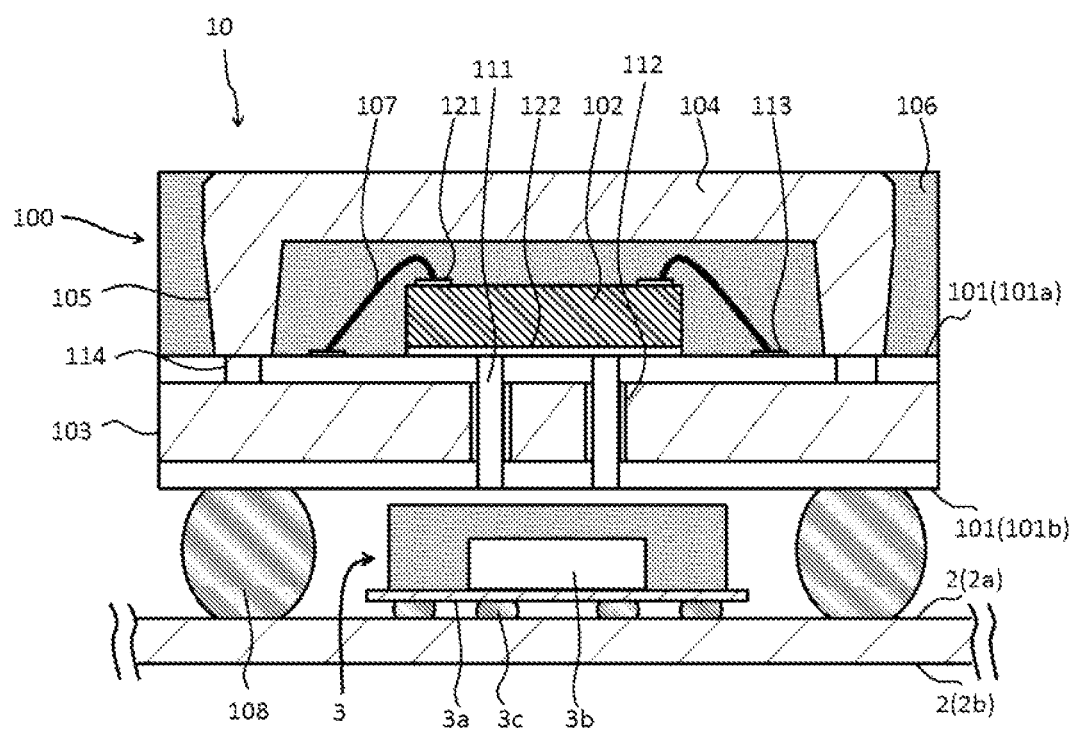
FIG. 18 is a cross-sectional view of an information processing device according to a fifth embodiment.
Figure 19A:
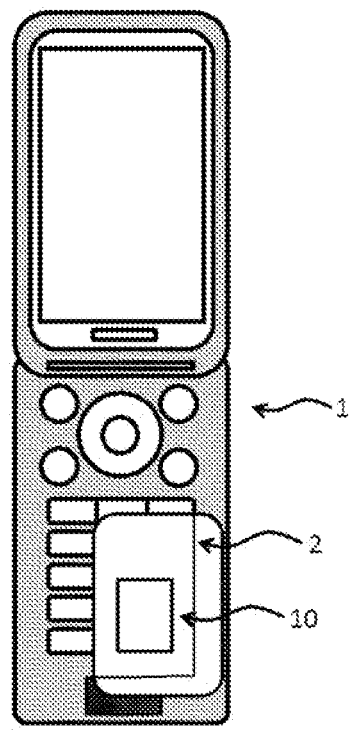
FIGS. 19A and 19B illustrate an internal configuration of a host device in which the information processing device is mounted.
Figure 19B:
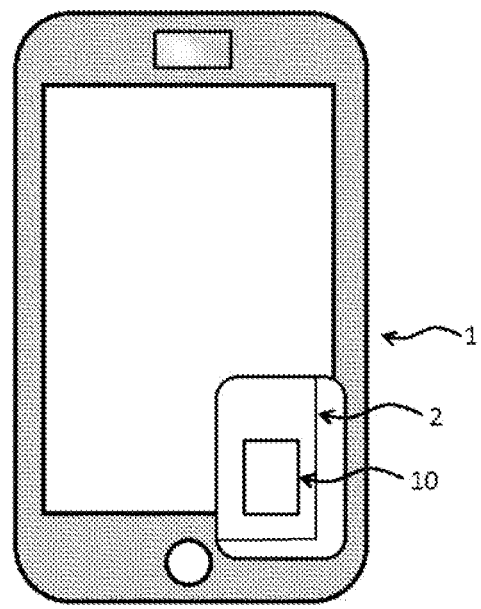

FIG. 18 is a cross-sectional view of a memory device 100 according to the first to fourth embodiments, which is mounted on an information processing device 10. In addition, FIGS. 19A and 19B illustrate a host device 1 with a partially transparent portion in which the information processing device 10 is mounted. The host device 1 here is, for example, a mobile phone or smart phone; FIG. 19A illustrates a case where the host device 1 is a mobile phone, and FIG. 19B illustrates a case where the host device 1 is a smart phone. However, the host device 1 is not limited thereto.

The information processing device 10 includes a mother board 2, a CPU 3, and the memory device 100. The CPU 3 includes a package substrate 3a, a CPU chip 3b, and a plurality of solder balls 3c.

The mother board 2 is, for example, a multilayer wiring board which includes a power supply layer (not shown), a ground layer, or the like. The mother board 2 is a substantially rectangular circuit board and formed of the same material as that of the substrate 101, such as the glass epoxy resin, and includes a first surface 2a and a second surface 2b, which is opposite to the first surface 2a. Both of the CPU 3 and the memory device 100 are mounted on the first surface 2a of the mother board 2.

The CPU 3 controls the entire operation of the host device 1. The CPU 3 performs, for example, a predetermined process by loading firmware (a control program or the like) stored in the memory device 100. In addition, the CPU 3 receives commands, for example, a write command, a read command, and an erase command from the host device 1, and then accesses a region on the memory device 100 or control a data transfer process.

For example, when the CPU 3 performs the writing in the memory device 100, in response to the command received from the host device 1, data from the solder ball 3c is output to the memory device 100 via the internal wiring (not shown) of the mother board 2, through the solder ball 108.

It is desirable that a non-volatile memory which performs the writing and reading of data with a high processing speed and small electrical power consumption is mounted on the information processing device 10 which is used for the host device 1 such as the mobile phone.

Typically, the memory having the structure as illustrated in FIG. 4 and FIG. 5 is a nonvolatile memory performing processes with the high speed and the small electrical power consumption. However, when the typical memory is mounted on the host device 1, the memory is likely to be affected by an external magnetic field. This is because that the host device 1 such as the mobile phone in FIGS. 19A and 19B typically includes a speaker or a microphone, and a magnetic field generated by a permanent magnet which is provided in the speaker or the microphone may have an influence on data of the memory.

In the present embodiment, by mounting the memory device 100 according to the first to fourth embodiments on the information processing device 10, it is possible to use the memory device 100 while reducing the influence of the magnetic field due to the speaker, the microphone, or the like, and therefore the information processing device 10 which has high performance and reliability can be obtained.

When the host device 1 is assumed to be the mobile phone, in the present embodiment, the memory device 100 and the CPU 3 are vertically arranged as illustrated in FIG. 18 in consideration of the restriction of a mounting space. However, both of the memory device 100 and the CPU 3 may be mounted in a line on any surface of the mother board 2, or one of them may be mounted on the first surface 2a and the other may be mounted on the second surface 2b.

Figure 20:
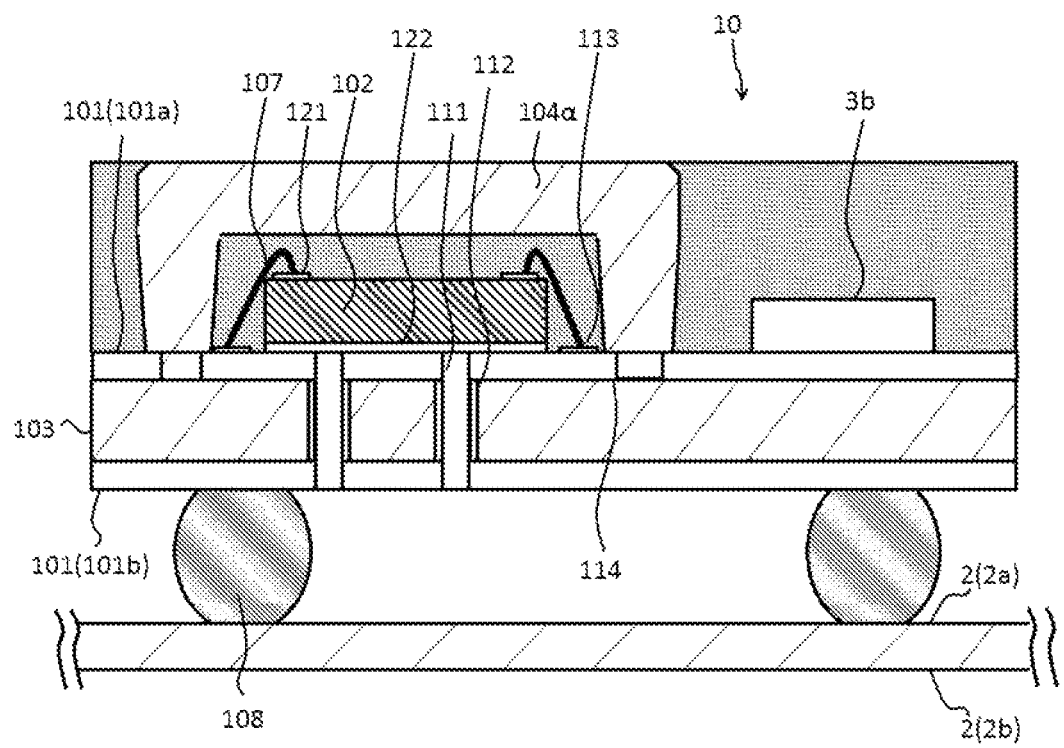
FIG. 20 is a cross-sectional view of another example of the information processing device according to the fifth embodiment.

Further, as illustrated in FIG. 20, the information processing device 10 may be mounted on the mother board 2 as a package. In this case, the second magnetic body 104α may cover only the magnetoresistive memory chip 102, and the CPU chip 3b may be also covered with the second magnetic body 104α. In addition, the memory device 100 and the CPU 3, which form the information processing device 10 as illustrated in FIG. 18, may be covered with a resin or a housing. Meanwhile, the information processing device 10 in this case may be also referred to as a semiconductor device 10.

In addition to the memory device 100 and the CPU 3, for example, a system LSI in which all NAND memories 304 is covered with the resin or the housing may be adopted. In this case, it is possible for the CPU3 to properly use the NAND memory 304 and the memory device 100 in accordance to the usage. At this time, the second magnetic body 104α may cover only the magnetoresistive memory chip 102, and the CPU chip 3b may be also covered with the second magnetic body 104α.

Sixth Embodiment

Figure 21:
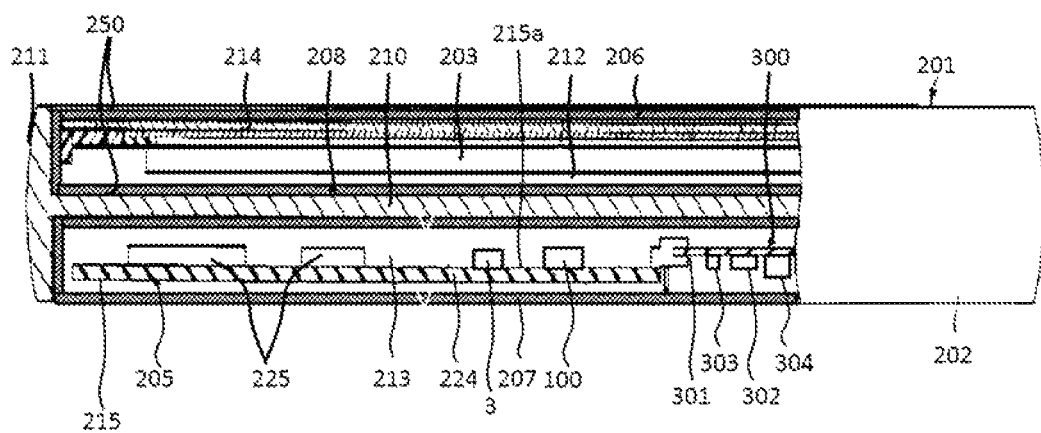
FIG. 21 is a cross-sectional view of a tablet-type portable computer according to a sixth embodiment.

FIG. 21 a cross-sectional view of a tablet-type portable computer 201 in which the memory device 100 according to the first to fourth embodiments is mounted. In the description in the present embodiment, the same components as those of the first to fourth embodiments are described with the same reference numerals and the detailed description thereof will be omitted.

The tablet-type portable computer 201 is an example of the host device 1 in the first to fifth embodiments. Typically, the tablet-type portable computer 201 has a size larger than that of the mobile phone or the smart phone as illustrated in FIGS. 19A and 19B in such a manner that a user may use by using his or her hands.

The tablet-type portable computer 201 includes a housing 202, a display module 203, a semiconductor device 300, and a main board 205. The housing 202 includes a protective plate 206, a base 207, and a frame 208.

The semiconductor device 300 functions as an external memory of the tablet-type portable computer 201, such as a solid state drive (SSD), but the configuration is not limited thereto.

The semiconductor device 300 includes, for example, a substrate 301, a controller 302, a DRAM 303, and the NAND memory 304.

The protective plate 206 which is formed into a square plate is made of glass or plastic, and configures a top surface of the housing 202. The base 207 is, for example, made of metal such as an aluminum alloy or a magnesium alloy, and configures a bottom of the housing 202.

The frame 208 is provided between the protective plate 206 and the base 207. The frame 208 is made of metal such as an aluminum alloy or a magnesium alloy, and includes a mounting portion 210 and a bumper portion 211 integrally. The mounting portion 210 is disposed between the protective plate 206 and the base 207. According to the present embodiment, the mounting portion 210 defines a first mounting space 212 between the mounting portion 210 and the protective plate 206, and defines a second mounting space 213 between the mounting portion 210 and the base 207.

The bumper portion 211 is integrally formed with an outer edge portion of the mounting portion 210, and surrounds the first mounting space 212 and the second mounting space 213 in a circumferentially continuous manner. Further, the bumper portion 211 extends in the thickness direction of the housing 202 so as to connect the outer edge portion of the protective plate 206 and the outer edge portion of the base 207 and thus forms an outer peripheral surface of the housing 202.

The display module 203 is contained in the first mounting space 212 of the housing 202. The display module 203 is covered with the protective plate 206 and a touch panel 214 having a handwriting input function is disposed between the protective plate 206 and the display module 203. The touch panel 214 is connected to a rear surface of the protective plate 206.

A main board 205 has a plurality of circuit components 216 such as a substrate 215, the CPU 3, the memory device 100, and a semiconductor package, and the substrate 215 includes a first surface 215a (mounting surface) in which a plurality of conductor patterns (not shown) are formed. The CPU 3, the memory device 100, and the circuit component 216 are, for example, mounted on the first surface 215a of the substrate 215, and then soldered on the conductor patterns.

In the present embodiment, the CPU 3 and the memory device 100 are not vertically stacked unlike the configuration illustrated in FIG. 18. As illustrated in FIG. 21, in the information processing device 10, the CPU 3 and the memory device 100 may be aligned on the first surface 215a of the substrate 215. Although the required area for mounting the CPU 3 and the memory device 100 on the substrate 215 becomes larger, the heat caused by the CPU 3 is less likely to remain around the CPU 3 in comparison to the case of the vertically-stacked configuration, and thus it is possible to improve the heat radiation property.

In the present embodiment, the housing 202 is coated with a magnetic film 250 as illustrated in FIG. 21. As described above, the memory device 100 is needed to prevent the external magnetic field from intruding into the inside. The memory device 100 has a magnetic shield mechanism as described in the first to fourth embodiments.

In the present embodiment, the external magnetic field proceeding towards the tablet-type portable computer 201 is shielded by the magnetic film 250 which is provided in the housing 202, and the first magnetic body 103 and the second magnetic body 104α which are provided in the memory device 100, and therefore, it is possible to obtain the excellent shield effect. The material of the housing 202 may be mixed with the magnetic material filler so as to obtain the same effect as that in the case of using the magnetic film 250.

Moreover, the memory device 100 according to the first to fourth embodiments may be mounted as a substitute for a DRAM 303 which is mounted on the semiconductor device 300 such as an SSD. The DRAM 303 is a volatile memory whereas the memory device 100 is a nonvolatile memory which has an advantage in that data which is stored in the memory is not deleted at the time of unexpected power interruption.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device, comprising:
a magnetic memory unit having a plurality of magnetic memory cells, a first surface, and a second surface opposite to the first surface, the first and second surfaces extending in a direction parallel to a direction in which the magnetic memory cells are arranged;
a first magnetic shield unit extending below the first surface;
a plurality of vias extending from the first surface, penetrating through the first magnetic shield unit, and electrically insulated from the first magnetic shield unit; and
a second magnetic shield unit having a first portion that extends over the second surface and a plurality of second portions that extends from the first portion towards the first magnetic shield unit and is directly in contact with the first shield magnetic unit.

2. The magnetic memory device according to claim 1, further comprising:
a sealing layer disposed in a space between the magnetic memory unit and the second magnetic shield unit and entirely covering the magnetic memory unit.

3. The magnetic memory device according to claim 2, wherein
the sealing layer entirely encloses the second portions of the second magnetic shield unit, and
an outer surface of the first portion is not covered with the sealing layer.

4. The magnetic memory device according to claim 1, further comprising:
a wiring layer that is disposed on the first magnetic shield unit and on which the magnetic memory unit is disposed, wherein
the wiring layer has a plurality of holes, and each of the second portions of the second magnetic shield unit has a portion that fits in one of the holes to provide the direct contact with the first magnetic shield unit.

5. The magnetic memory device according to claim 4, wherein
the first portion and the second portions of the second magnetic shield unit are integrally formed.

6. The magnetic memory device according to claim 4, further comprising:
a third magnetic shield unit having a third portion extending over the first portion of the second magnetic shield unit and a fourth portion extending from the third portion towards the first magnetic shield unit.

7. The magnetic memory device according to claim 6, wherein
the fourth portion of the third magnetic shield unit is in contact with a side surface of the first magnetic shield unit.

8. The magnetic memory device according to claim 6, wherein
the third portion of the third magnetic shield unit is in contact with the first portion of the second magnetic shield unit.

9. The magnetic memory device according to claim 4, further comprising:
a memory controller configured to control the magnetic memory unit and disposed on the wiring layer.

10. The magnetic memory device according to claim 1, wherein
each of the second portions of the second magnetic shield unit is in contact with a side surface of the first magnetic shield unit.

11. The magnetic memory device according to claim 10, wherein
each of the second portion of the second magnetic shield unit has an engaging portion that is engaged with the first magnetic shield unit.

12. The magnetic memory device according to claim 1, wherein
a plurality of magnetic memory units is stacked, and each magnetic memory unit includes a plurality of magnetic memory elements arranged in a matrix form.

13. The magnetic memory device according to claim 4, further comprising:
a second wiring layer disposed on a surface of the first magnetic shield unit that is opposite to a surface on which the wiring layer is disposed, wherein
the plurality of vias electrically connects the wiring layer and the second wiring layer.

14. A magnetic memory device, comprising:
a magnetic memory unit having a plurality of magnetic memory cells, a first surface, and a second surface opposite to the first surface, the first and second surfaces extending in a direction parallel to a direction in which the magnetic memory cells are arranged;
a first magnetic shield unit below the first surface;
a plurality of vias, extending from the first surface, penetrating through the first magnetic shield unit, and electrically insulated from the first magnetic shield unit;
a second magnetic shield unit over the second surface; and
a third magnetic shield unit that is directly in contact with the first and second magnetic shield units and magnetically connecting the first magnetic shield unit and the second magnetic shield unit.

15. The magnetic memory device according to claim 14, further comprising:
a sealing layer disposed in a space between the magnetic memory unit and the second magnetic shield unit and entirely covering the magnetic memory unit.

16. The magnetic memory device according to claim 15, wherein
the sealing layer entirely encloses the third magnetic shield unit, and
an outer surface of the second magnetic shield unit is not covered with the sealing layer.

17. The magnetic memory device according to claim 14, further comprising:
a wiring layer that is disposed on the first magnetic shield unit and on which the magnetic memory unit is disposed, wherein
the wiring layer has a hole, and the third magnetic shield unit has a portion that fits in the hole to provide the direct contact with the first magnetic shield unit.

18. The magnetic memory device according to claim 17, wherein
the wiring layer has a plurality of holes, and
a plurality of third magnetic shield units is in contact with the first magnetic shield unit through one of the holes.

19. The magnetic memory device according to claim 17, further comprising:
a second wiring layer disposed on a surface of the first magnetic shield unit that is opposite to a surface on which the wiring layer is disposed, wherein the plurality of vias electrically connects the wiring layer and the second wiring layer.

20. The magnetic memory device according to claim 14, wherein
a plurality of magnetic memory units is stacked, and each magnetic memory unit includes a plurality of magnetic memory elements arranged in a matrix form.

* * * * *